(12) United States Patent
Bradley et al.

(10) Patent No.: US 6,262,637 B1
(45) Date of Patent: Jul. 17, 2001

(54) DUPLEXER INCORPORATING THIN-FILM BULK ACOUSTIC RESONATORS (FBARS)

(75) Inventors: Paul D. Bradley, Mountain View; John D. Larson, III, Palo Alto; Richard C. Ruby, Menlo Park, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/324,618

(22) Filed: Jun. 2, 1999

(51) Int. Cl.[7] .............................. H03H 9/54; H03H 9/56; H03H 9/70
(52) U.S. Cl. .................. 333/133; 333/189; 333/191; 310/322; 310/366
(58) Field of Search ........................ 333/133, 187–192; 310/322, 324, 349, 366

(56) References Cited

U.S. PATENT DOCUMENTS

| | | | |
|---|---|---|---|
| 5,194,836 | * 3/1993 | Vale et al. | 333/133 |
| 5,231,327 | * 7/1993 | Ketcham | 333/189 X |
| 5,872,493 | * 2/1999 | Ella | 333/191 |
| 5,905,418 | * 5/1999 | Ehara et al. | 333/133 X |
| 5,910,756 | * 6/1999 | Ella | 333/133 |
| 5,942,958 | * 8/1999 | Lakin | 333/189 |
| 6,081,171 | * 6/2000 | Ella | 333/189 |

OTHER PUBLICATIONS

C. Vale et al, "FBAR Filters at GHz Frequencies", Forty-Fourth Annual Symposium on Frequency Control, IEEE, May 23–25, 1990, pp. 332–336.

* cited by examiner

Primary Examiner—Robert Pascal
Assistant Examiner—Barbara Summons
(74) Attorney, Agent, or Firm—Ian Hardcastle

(57) ABSTRACT

An FBAR-based duplexer that comprises a first port, a second port, a third port, a first band-pass filter connected between the first port and the third port and a series circuit connected between the second port and the third port. The first band-pass filter includes a first ladder circuit having shunt and series elements. Each of the elements of the first ladder circuit comprises a film bulk acoustic resonator (FBAR). The series circuit includes a 90° phase shifter in series with a second band-pass filter. The second band-pass filter includes a second ladder circuit having shunt and series elements. Each of the elements of the second ladder circuit comprises a film bulk acoustic resonator. A band-pass filter comprising shunt elements and series elements in which the series elements and the shunt elements are connected to form a ladder circuit, and each of the elements includes a film bulk acoustic resonator (FBAR).

23 Claims, 6 Drawing Sheets

DUPLEXER INCORPORATING THIN-FILM BULK ACOUSTIC RESONATORS (FBARS)

FIELD OF THE INVENTION

The invention relates to electronic components and, in particular, to electronic components for use in high-power radio-frequency circuits.

BACKGROUND OF THE INVENTION

In many different communications applications, a common signal path is coupled both to the input of a receiver and to the output of a transmitter. For example, in a transceiver, such as a cellular or cordless telephone, an antenna may be coupled to the input of the receiver and to the output of the transmitter. In such an arrangement, a duplexer is used to couple the common signal path to the input of the receiver and to the output of the transmitter. The duplexer provides the necessary coupling while preventing the modulated transmit signal generated by the transmitter from being coupled from the antenna back to the input of the receiver and overloading the receiver.

One long-established form of duplexer is the half duplexer. Half duplexers are described by C. K. Campbell in SURFACE ACOUSTIC WAVE DEVICES FOR MOBILE AND WIRELESS COMMUNICATION., pp. 253–272, Academic Press, New York, (1998). A half duplexer uses a switch to connect the antenna to the receiver or the transmitter on a time division basis. The half duplexer has good coupling and attenuation properties, but is nevertheless an unacceptable solution for telephony applications because it does not allow both parties to speak (and be heard) simultaneously.

A more acceptable form of duplexer for telephony applications is the full duplexer, also described by Campbell. To enable a full duplexer to be used, the transmit signal must be at a different frequency from the receive signal. The full duplexer lacks a switch and incorporates band-pass filters that isolate the transmit signal from the receive signal according to the frequencies of the signals. FIG. 1 shows a conventional front-end circuit 10 such as that used in a cellular telephone, personal communication system (PCS) device or other transmit/receive apparatus. In this, the output of the power amplifier 12 of the transmitter 14 and the input of the low-noise amplifier 16 of the receiver 18 are connected to the duplexer 20, which is a full duplexer. Also connected to the duplexer is the antenna 22.

The duplexer 20 is a three-port device having a transmit port 24, a receive port 26 and an antenna port 28. The antenna port is connected to the transmit port through the band-pass filter 30 and to the receive port through the series arrangement of the 90° phase shifter 34 and band-pass filter 32. The pass bands of the band-pass filters 30 and 32 are respectively centered on the frequency range of the transmit signal generated by the transmitter 14 and that of the receive signals to which the receiver 18 can be tuned. In the example shown, band-pass filters are configured such that the high-frequency stop band of the band-pass filter 30 overlaps the pass-band of the band-pass filter 32 and the low-frequency stop band of the band-pass filter 32 overlaps the pass-band of the band-pass filter 30.

The requirements for the band-pass filters 30 and 32 constituting the duplexer 20 are quite stringent. The band-pass filters isolate the very weak receive signal generated by the antenna 22 and fed to the input of the low-noise amplifier 16 from the strong transmit signal generated by the power amplifier 12. In a typical embodiment, the sensitivity of the low noise amplifier 16 is of the order of −100 dBm, and the power amplifier 12 can feed power levels of about 28 dBm into the duplexer. In such an example, the duplexer must attenuate the transmit signal by about 50 dB between the antenna port 28 and the receive port 26 to prevent the residual transmit signal mixed with the receive signal at the receive port from overloading the low-noise amplifier.

One type of mobile telephone that is becoming increasingly popular is the personal communication system (PCS) that uses Code Division Multiple Access (CDMA). CDMA PCS is described in T. S. Rapport, ed., CELLULAR RADIO & PERSONAL COMMUNICATIONS, VOL. 2, pp.501–509, IEEE Press, Piscataway, N.J., (1996). CDMA PCS devices operate in frequency bands at about 1,900 MHz and impose especially stringent requirements on the duplexer performance. The guard band between the portions of the spectrum assigned to the transmit signal and the receive signal is only about 1% of the carrier frequency, i.e., 20 MHz. The bandwidth of the portions of the spectrum assigned to the transmit signal and the receive signal are about 3% of the carrier frequency, i.e., 60 MHz. This means that the band-pass filters 30 and 32 are required to have an extremely sharp roll-off. FIG. 2 shows the basic arrangement of the transmit and receive bands. The required characteristics of the band-pass filters 30 and 32 are shown at 36 and 38, respectively.

Cellular telephones and PCS devices are constantly being made smaller and lower in cost. Several stacked printed circuit boards are typically used to accommodate the circuitry of the PCS device in the overall package size. Not only must the components mounted on the printed circuit boards be miniaturized, they must meet stringent height requirements. Components taller than the height limit require the printed circuit boards to be spaced further apart, which reduces the packing density that can be achieved. Alternatively, over-height components require that holes be cut in at least one adjacent printed circuit board to accommodate them, which both reduces the packing density and increases assembly costs.

Another challenge for the duplexer 20 is its power handling capability. The power amplifier 12 in the transmitter 14 can deliver up to 1 Watt of power to the transmit port 24 of the duplexer 20. Miniaturized as just described, the band-pass filters 30 and 32 must be capable of transmitting such power without being destroyed, or without its characteristics degrading with use.

Current-generation PCS devices use a ceramic filter as the duplexer 20. However, such ceramic filters are bulky, measuring some 28×8×5 mm, are over-height components and are expensive. Samples of such filters show evidence of having been individually tuned, which accounts for some of the cost of such devices.

Surface acoustic wave (SAW) filters have also been used as duplexers in cellular telephones and PCS devices, see, for example, O. Ikata, N. Nishihara, Y. Satoh, H. Fukushima and N. Hirisawa, *A Design of Antenna Duplexer Using Ladder Type SAW Filters,* PROC. 1998 IEEE INTERNATIONAL ULTRASONICS SYMPOSIUM, SENDAI, JAPAN, paper O-1 (Oct. 1998). The roll-off of a SAW filter with sufficient power handling capability is insufficiently steep for the CDMA application just described. Instead, two SAW filters and an electronic switch have to be used. One of the filters covers the upper half of the transmit and receive bands, the other covers the lower half of the transmit and receive bands. The electronic switch selects the appropriate filter depending on the portions of the transmit and receive bands in which the PCS device is operating. Thus, a duplexer based on SAW filters is also unacceptable bulky, complex, expensive and may be subject to failure in the event of a surge in the transmitter output power.

What is needed, then, is a duplexer that has sufficiently steep filter characteristics to enable it to be used in applications, such as CDMA PCS devices, in which the separation between the transmit and receive bands is only about 1% of the operating frequency and in which power levels exceeding one Watt do not impair the reliability of the duplexer or the long-term stability of the filter characteristics. The duplexer should be substantially smaller than current duplexers based on ceramic filters or SAW filters, and should not require individual tuning so that the cost of manufacture can be kept low.

SUMMARY OF THE INVENTION

The invention provides an FBAR-based duplexer that comprises a first port, a second port, a third port, a first band-pass filter connected between the first port and the third port and a series circuit connected between the second port and the third port. The first band-pass filter includes a first ladder circuit having shunt and series elements. Each of the elements of the first ladder circuit comprises a film bulk acoustic resonator (FBAR). The series circuit includes a 90° phase shifter in series with a second band-pass filter. The second band-pass filter includes a second ladder circuit having shunt and series elements. Each of the elements of the second ladder circuit comprises an FBAR.

The FBARs comprised in the elements of at least one of the band-pass filters may collectively have two different resonant frequencies.

The FBARs comprised in the elements of at least one of the band-pass filters may collectively have more than two different resonant frequencies.

The FBARs comprised in the elements of at least one of the band-pass filters may all have different resonant frequencies.

At least one of the elements of the band-pass filters may additionally comprise an auxiliary inductor in series with the FBAR comprised therein.

The FBARs comprised in the series elements of at least one of the band-pass filters may all have the same resonant frequency, and the FBARs comprised in the shunt elements of the at least one of the band-pass filters may also all have the same resonant frequency, different from the resonant frequency of the FBARs comprised in the series elements.

The FBAR with the auxiliary inductor in series includes a shunt capacitance, and the auxiliary inductor has an inductance that has a series resonance with the shunt capacitance at a frequency corresponding to: the upper band limit of the first band-pass filter, the lower band limit of the first band-pass filter, the upper band limit of the second band-pass filter, or the lower band limit of the second bandpass filter.

The duplexer may additionally comprise an auxiliary inductance in series with a common ground connection to two of the shunt elements of at least one of the band-pass filters.

The FBAR comprised in one of the shunt elements may include a first FBAR and a second FBAR in series.

The invention also provides a band-pass filter comprising shunt elements and series elements in which the series elements and the shunt elements are connected to form a ladder circuit, each of the elements includes an FBAR and the FBARs collectively have more than two different resonant frequencies.

The invention also provides a band-pass filter comprising shunt elements and series elements in which the series elements and the shunt elements are connected to form a ladder circuit, each of the elements includes an FBAR and at least one of the elements additionally includes an auxiliary inductor in series with the FBAR included therein.

Finally, the invention provides a band-pass filter comprising shunt elements and series elements in which the series elements and the shunt elements are connected to form a ladder circuit, each of the elements includes an FBAR, the FBARs each have a resonant frequency, the FBARs included in the series elements all have the same resonant frequency, and the FBARs included in the shunt elements all have the same resonant frequency, different from the resonant frequency of the FBARs included in the series elements.

DETAILED DESCRIPTION OF THE INVENTION

Figure 3A:
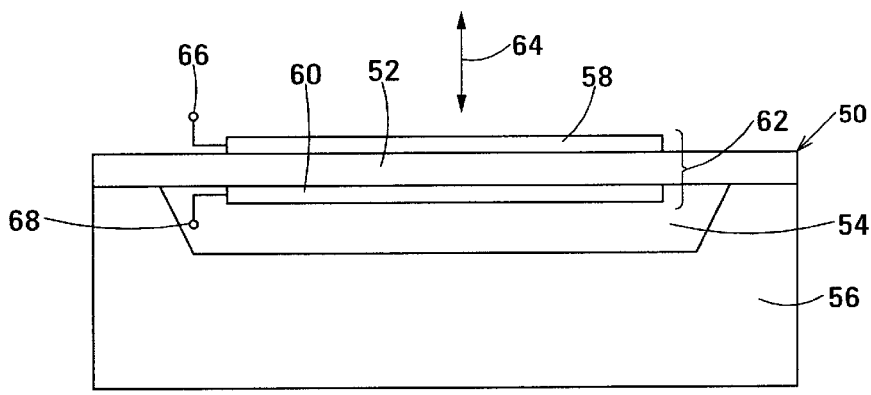
FIG. 3A is a cross-sectional view of a thin-film bulk acoustic resonator (FBAR).

In recent years, thin-film bulk acoustic resonators (FBARs) have been described in the patent literature. For example, FBARs are described in U.S. Pat. No. 5,587,620, assigned to the assignee of this disclosure and incorporated herein by reference. An example of an FBAR 50 is shown in FIG. 3A.

The FBAR 50 is composed of the piezoelectric layer 52 suspended at its periphery over the well 54 defined by the substrate 56. The electrodes 58 and 60 are located on opposite surfaces of the portion of the piezoelectric layer that overlaps the well. Electrical connections are made to the electrodes 58 and 60 via the terminals 66 and 68, respectively. The piezoelectric layer 52 and the electrodes 58 and 60 form the piezoelectric resonator stack 62. The piezoelectric resonator stack expands and contracts in the direction indicated by the arrow 64 in response to the magnitude and direction of a voltage applied between the electrodes.

When the piezoelectric resonator stack 62 composed of the piezoelectric layer 52 and the electrodes 58 and 60 is suspended at its periphery and has both of its major surfaces in contact with air, other ambient gas or vacuum, the piezoelectric resonator stack forms a high-Q acoustic resonator. An a.c. signal applied via the terminals 66 and 68 to the electrodes 58 and 60 will cause the piezoelectric resonator stack to resonate when the signal has a frequency equal to the velocity of sound in the piezoelectric resonator stack divided by twice the weighted thickness of the stack, i.e., $f_r = c/2t_0$, where $f_r$ is the resonant frequency, c is the velocity of sound in the stack and $t_0$ is the weighted thickness of the stack. The resonant frequency of the piezoelectric resonator stack depends on the weighted thickness of the stack rather than the physical thickness because the different velocity of sound in the materials constituting the stack.

In a practical example of the FBAR 50 with a resonance at about 1,900 MHz, the substrate 56 is a wafer of single-crystal silicon, the piezoelectric layer 52 is a layer of aluminum nitride (AlN) about 2 $\mu$m thick and the electrodes 58 and 60 are layers of molybdenum about 0.1 $\mu$m thick. Molybdenum is the preferred material for the electrodes because, in this thin-film embodiment, the electrodes constitute a significant portion of the mass of the piezoelectric resonator stack 62. Thus, the acoustic properties of the material of the electrodes have a significant effect on the Q of the piezoelectric resonator stack. Molybdenum has superior acoustic properties to those of common electrode materials such as gold and aluminum, so molybdenum electrodes enable the FBAR 50 to have a higher Q than electrodes of other materials. Further details of the structure and fabrication of FBARs are disclosed in the above-mentioned patent and in U.S. patent application Ser. No. 09/088,964, assigned to the assignee of this disclosure and incorporated herein by reference.

Figure 3B:
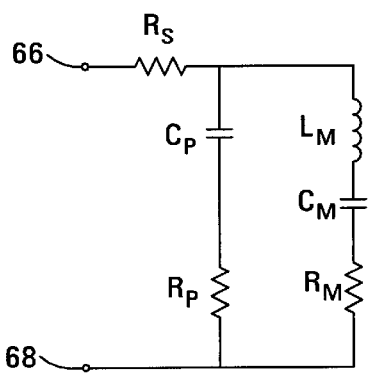
FIG. 3B is a schematic drawing showing the equivalent circuit of the FBAR shown in FIG. 3A.

FIG. 3B shows an equivalent circuit for the FBAR 50. The main reactive component is the shunt capacitance $C_p$, which is the capacitance of the capacitor formed by the electrodes 58 and 60 and the piezoelectric layer 52. The piezoelectric layer is the dielectric of the shunt capacitor $C_p$. The resistor $R_p$ represents the series resistance of the shunt capacitance $C_p$. The inductance $L_M$ and the capacitance $C_M$ represent the inductance and capacitance of the piezoelectric resonator stack 62. The resistor $R_M$ represents the loss in the piezoelectric resonator stack. The resistor $R_S$ represents the series electrical resistance of the connections between the terminals 66 and 68 and the piezoelectric resonator stack 62.

Figure 3C:
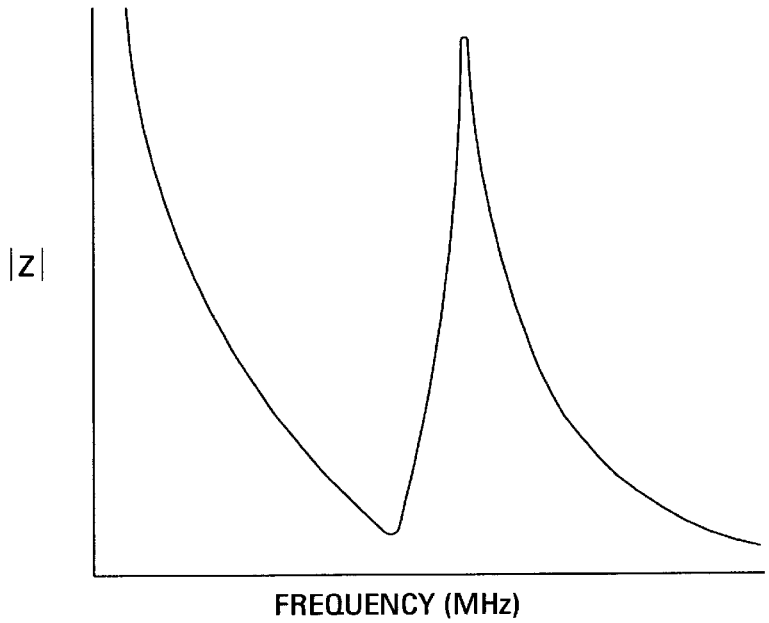
FIG. 3C is a graph showing the modulus of the impedance of the FBAR shown in FIG. 3A against frequency.

FIG. 3C is a graph showing the modulus of the impedance |Z| measured between the terminals 66 and 68 plotted against frequency. As the frequency increases, the impedance gradually falls due to the falling impedance of the shunt capacitance $C_p$. The impedance eventually reaches a minimum at the frequency of the series resonance between the mechanical inductance $L_M$ and the mechanical capacitance $C_M$. The impedance then sharply increases and reaches a maximum at the frequency of the parallel resonance between the mechanical inductance $L_M$ and the series combination of the mechanical capacitance $C_M$ and the shunt capacitance $C_p$. Since shunt capacitance is about 20 times the mechanical capacitance, the frequency difference between the series and parallel resonances is small. The impedance falls steeply as the frequency increases above the frequency of the parallel resonance. References in this disclosure to the resonant frequency of an FBAR should be taken to be references to the frequency of the parallel resonance of the FBAR unless otherwise stated.

Figure 4:
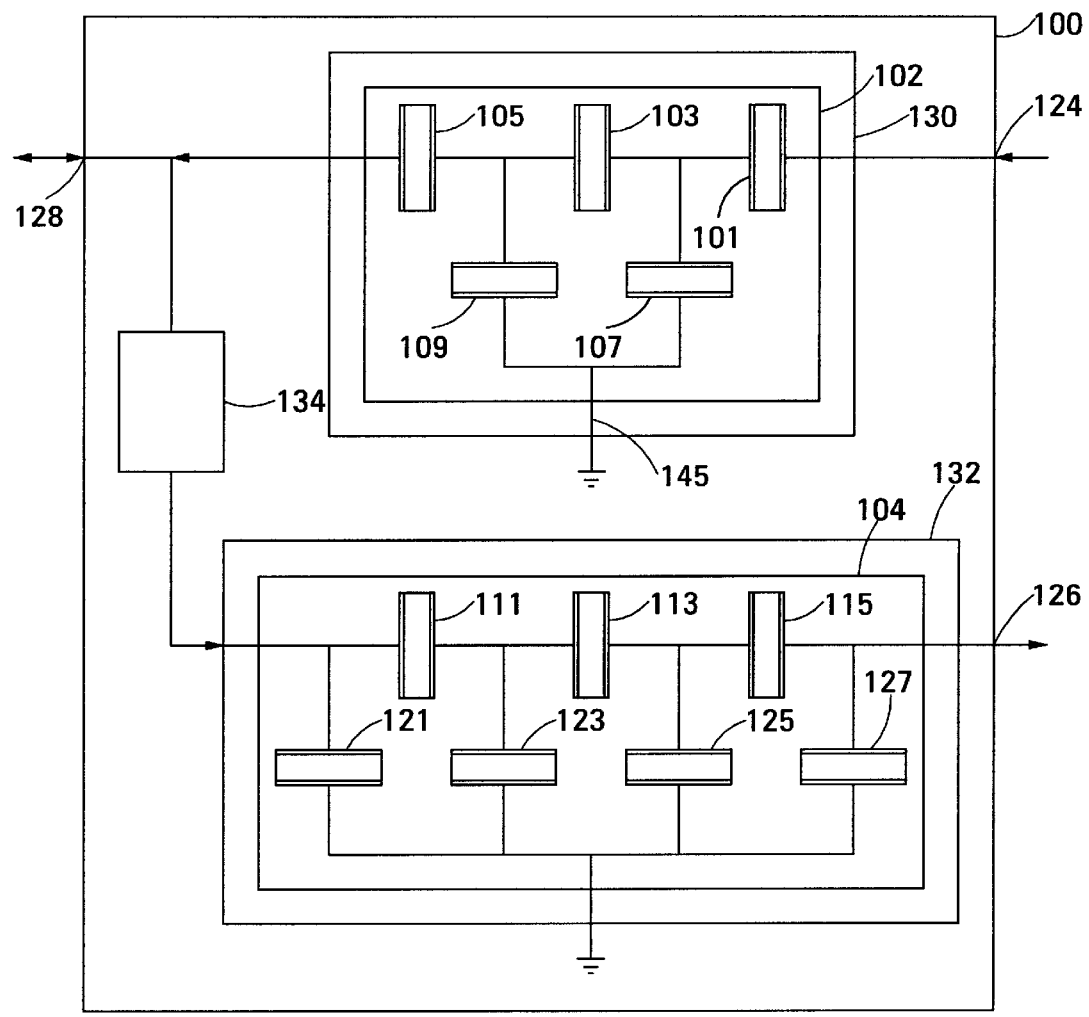
FIG. 4 is a schematic block diagram of a first embodiment of a duplexer according to the invention.

FIG. 4 is a schematic block diagram of a first working embodiment 100 of a duplexer according to the invention that incorporates the transmit FBAR array 102 and the receive FBAR array 104. The duplexer 100 is a three-port device suitable for use in a CDMA PCS device and including a transmit port 124, a receive port 126 and an antenna port 128. The duplexer is composed of the 90° phase shifter 134, the transmit band-pass filter 130 that includes the transmit FBAR array 102 and the receive band-pass filter 132 that includes the receive FBAR array 104. The transmit port is connected to the antenna port through the transmit band-pass filter 130. The antenna port is connected to the receive port through the series arrangement of the 90° phase shifter 134 and receive band-pass filter 132.

Figure 1:
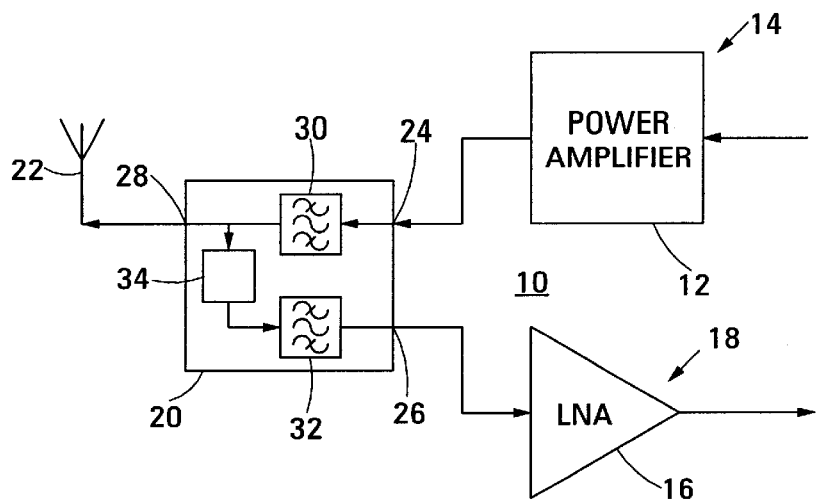
FIG. 1 is a block diagram showing the front-end circuit 10 of a conventional cellular telephone, personal communication system (PCS) device or other transmit/receive apparatus.
Figure 2:
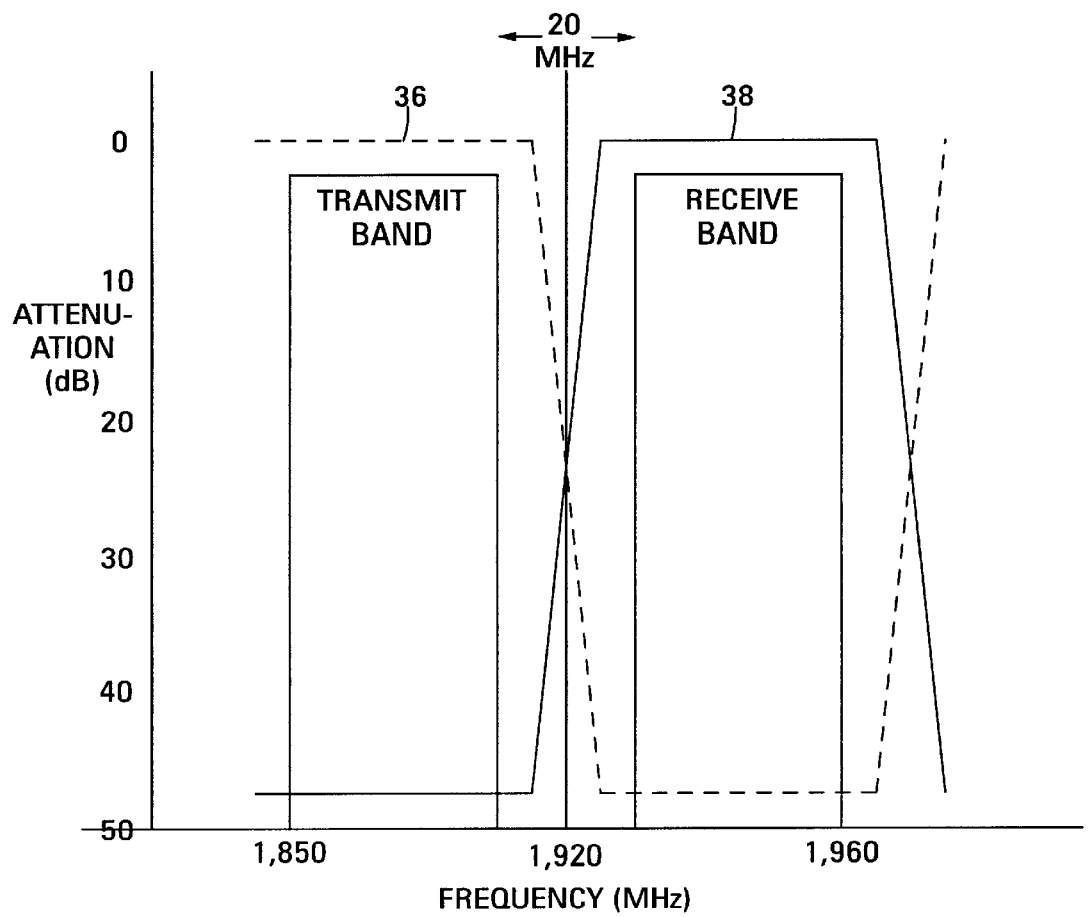
FIG. 2 is a graph showing the basic arrangement of the transmit and receive bands of a CDMA PCS device and the required characteristics of the transmit and receive band-pass filters constituting the duplexer thereof.

When used in a PCS device, cellular telephone or other transmit/receive apparatus, the antenna port 128 of the duplexer 100 is connected to an antenna (not shown), transmit port 124 is connected to the output of a transmitter (not shown) and the receive port 126 is connected to the input of a receiver (not shown) in a circuit arrangement similar to that shown in FIG. 1A. The pass bands of the band-pass filters 130 and 132 are respectively centered on the frequency range of the transmit signal generated by the transmitter and that of the receive signal to which the receiver can be tuned. In the example shown, the transmit and receive band-pass filters 130 and 132 are configured such that the high-frequency stop band of the transmit band-pass filter 130 that includes the transmit FBAR array 102 overlaps the pass-band of the receive band-pass filter 132 that includes the receive FBAR array 104 and the low-frequency stop band of the receive band-pass filter overlaps the pass-band of the transmit band-pass filter.

The structure of the transmit band-pass filter 130 will now be described. The transmit band-pass filter is composed of the transmit FBAR array 102. The transmit FBAR array is composed of the series FBARs 101, 103 and 105 and the shunt FBARs 107 and 109 connected to form a ladder circuit. The series FBARs are connected in series between the transmit port 124 and the antenna port 128, the shunt FBAR 107 is connected between ground and the node between the series FBARs 101 and 103 and the shunt FBAR 109 is connected between ground and the node between the series FBARs 103 and 105. Thus, in the example shown, the FBARs 101, 103, 105, 107 and 109 form a 2½-stage ladder circuit. However, the number of stages in the ladder circuit is not critical to the invention. The number of full stages, each composed of one series FBAR and one shunt FBAR, and the number of half stages, each composed of one series FBAR or one shunt FBAR, in the FBAR array 102 depends on the desired filter characteristics of the transmit band-pass filter 130 and the characteristics of the individual FBARs constituting the transmit FBAR array 102. For example, in one preferred embodiment, the transmit band-pass filter is a two-stage filter that lacks the FBAR 105.

The structure of the receive band-pass filter 132 will now be described. The receive band-pass filter is composed of the receive FBAR array 104. The receive FBAR array is composed of the series FBARs 111, 113 and 115 and the shunt FBARs 121, 123, 125 and 127 connected to form a ladder circuit. The series FBARs are connected in series between the end of the 90° phase shifter 134 remote from the antenna port 128 and the receive port 126. The shunt FBAR 121 is connected between ground and the node between the series FBAR 111 and the end of the 90° phase shifter 134 remote from the antenna port 128. The shunt FBAR 123 is connected between ground and the node between the series FBARs 111 and 113, the shunt FBAR 125 is connected between ground and the node between the series FBARs 113 and 115 and the shunt FBAR 127 is connected between ground and the node between the series FBAR 115 and the receive port 126. Thus, in the example shown, the FBARs 111, 113, 115, 121, 123, 125 and 127 form a 3½-stage ladder circuit. However, the number of stages in the ladder circuit is not critical to the invention. The number of full stages and the number of half stages required depends on the desired filter characteristics of the receive band-pass filter 132 and the characteristics of the individual FBARs constituting the receive FBAR array 104.

Circuits suitable for use as the 90° phase shifter 134 are known in the art. For example, the 90° phase shifter may be composed of lumped inductors and capacitors or a λ/4 transmission line.

To design the FBAR arrays 102 and 104 to provide the desired filter characteristics of the transmit and receive band-pass filters 130 and 132, respectively, the inventors used a commercial microwave design simulator called *Microwave Design System* (MDS), release 7.0 (1996), sold by HP EEsof Corp., Westlake Village, Calif. The individual FBARs of each FBAR array were modeled using the modified Butterworth-Van Dyke circuit shown in FIG. 3B. The design simulator was used to optimize the area and to calculate the required resonant frequencies of the FBARs in each of the FBAR arrays 102 and 104. The inventors used a physical simulator to model the piezoelectric resonator stack (shown at 62 in FIG. 3A) of each FBAR, to characterize the physical properties of the layers constituting the piezoelectric resonator stack and to calculate the thickness of the layers of the piezoelectric resonator stack constituting each FBAR to achieve the required resonant frequencies. The simulator was written in Mathcad 8, sold by MathSoft, Inc., Cambridge, Mass., and was based on the model described by W. P. Mason in PHYSICAL ACOUSTICS PRINCIPLES AND METHODS, Vol. 1A, pp. 239–247, Academic Press, New York (1964).

To provide the desired filter characteristics of the transmit band-pass filter 130 in the duplexer 100 of a CDMA PCS device, the series FBARs 101–105 constituting the transmit FBAR array 102 can all have the same resonant frequency and the shunt FBARs 107 and 109 can both have the same resonant frequency. However, the resonant frequency of the series FBARs is about 3% higher than that of the shunt FBARs.

Some applications may require that the filter characteristics of the transmit band-pass filter 130 be different from those provided by an embodiment of the transmit FBAR array 102 in which the series FBARs all have the same resonant frequency and the shunt FBARs all have the same resonant frequency, different from that of the series FBARs. In this case, the transmit FBAR array can be constructed from FBARs collectively having more than two different resonant frequencies.

The FBAR array 104 used in the receive band-pass filter 132 may also be composed of series FBARs all having the same resonant frequency and shunt FBARs all having the same resonant frequency, different from that of the series FBARs. However, in the duplexer 100 of a CDMA PCS device, the receive bandpass filter 132 is required to attenuate the transmit signal at the antenna port 128 to such a low level that the residual transmit signal mixed with the receive signal at the receive port 126 does not overload the highly-sensitive low-noise amplifier of the receiver connected to the receive port. Consequently, the transmit signal rejection requirements of the receive band-pass filter 132 are considerably more stringent than the receive signal rejection requirements of the transmit band-pass filter 130. Using present-day FBAR fabrication technology, it is difficult to meet this rejection requirement with an embodiment of the receive FBAR array 104 in which series FBARs all have the same resonant frequency and the shunt FBARs all have the same resonant frequency, different from that of the series FBARs.

To provide the desired filter characteristics of the receive band-pass filter 132 of a CDMA PCS device, in the receive FBAR array 104, not all the shunt FBARs can have the same resonant frequency, although all the series FBARs may have the same resonant frequency. In other words, the FBARs constituting the receive FBAR array should collectively have more than two different resonant frequencies. In some cases, the FBARs constituting the receive FBAR array may all have different resonant frequencies.

In the example shown, the resonant frequencies of the series FBARs 111, 113 and 115 of the receive FBAR array 104 are about 80 MHz higher than the resonant frequency of the series FBARs 101, 103 and 105 of the transmit FBAR array 102 to interleave the characteristics of the transmit and receive band-pass filters 130 and 132 as described above.

Figure 5A:
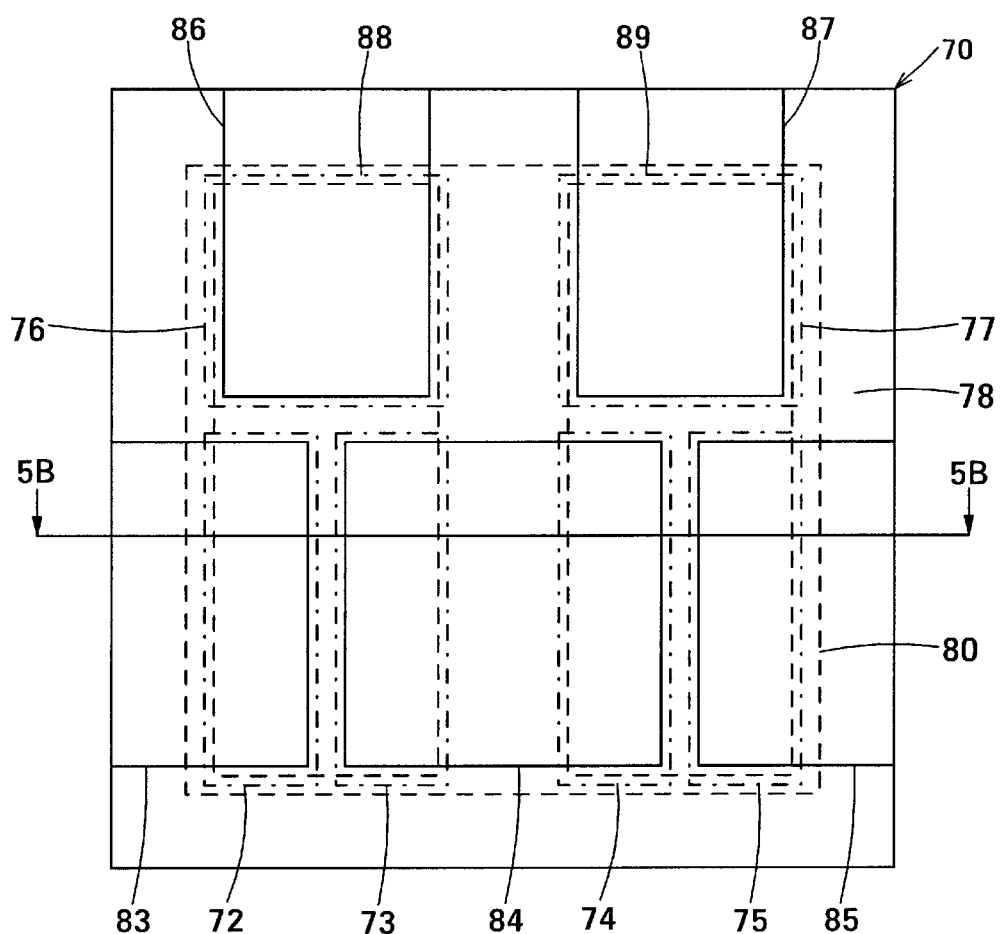
FIGS. 5A and 5B are a plan view and a cross-sectional view illustrating an FBAR array that can be used as part of the duplexer and band-pass filter according to the invention.
Figure 5B:
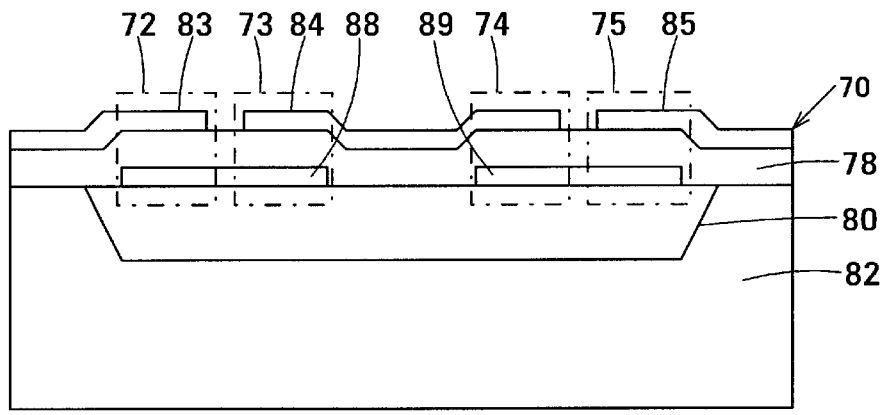

Recently, integrated FBAR arrays comprising a number of interconnected FBARs fabricated on a common piezoelectric layer have been demonstrated. Using such integrated FBAR arrays as the transmit FBAR array 102 and the receive FBAR array 104 enables very small embodiments of the duplexer 100 to be fabricated. FIGS. 5A and 5B illustrate the exemplary FBAR array 70 composed of the six FBARs 72, 73, 74, 75, 76 and 77 interconnected to form a ladder circuit such as is required for the FBAR arrays 102 and 104. As in the single FBAR 50 shown in FIG. 3A, the piezoelectric layer 78 is suspended at its periphery over the well 80 defined in the silicon substrate 82. Electrodes 83, 84, 85, 86 and 87 are located on portions of the surface of the piezoelectric layer remote from the substrate. Electrodes 88 and 89, indicated by broken lines in FIG. 5A, are located on portions of the surface of the piezoelectric layer facing the substrate. An FBAR exists where the electrodes on opposite surfaces of the piezoelectric layer overlap. For example, the FBAR 72 is defined where the electrodes 83 and 88 overlap.

As a preferred alternative to a single well 80 formed in the substrate 82, multiple wells, one for each of the FBARs 72–77, are formed in the substrate so that each of the FBARs is suspended over an individual well. Providing an individual well for each of the FBARs increases the Q and reliability of the FBARs.

The outline of each of the FBARs 72–77 is indicated by a dash-dot line. The outline shapes of the FBARs shown in the drawing are highly stylized to simplify the drawing. Practical FBARs, such as those described in U.S. patent application Ser. No. 09/282,082, assigned to the assignee of this disclosure and incorporated herein by reference, have irregular shapes with non-parallel sides of unequal lengths. Irregular shapes and non-parallel sides of unequal lengths reduces the incidence of spurious transverse resonances that would otherwise degrade the frequency response of the FBARs. Moreover, the FBARs constituting the FBAR array 70 are typically of different areas.

An integrated FBAR array fabricated on a silicon substrate about 0.8 mm square and 0.14 mm thick can be used to provide each the FBAR arrays 102 and 104 of the duplexer 100.

The characteristics of the individual FBARs constituting the FBAR arrays 102 and 104 depend on the thickness of the piezoelectric layer and the area and thicknesses of the electrodes of the FBAR. For example, in the integrated FBAR array 70, the characteristics of the FBAR 72 depend on the thickness of the piezoelectric layer 78, the area of overlap between the electrodes 83 and 88, and of the thickness of the electrodes 83 and 88.

Since the FBARs constituting the FBAR array 70 share the common piezoelectric layer 78, the resonant frequency of each of the FBARs in the array is set by defining the thickness of at least one of the electrodes of the FBAR.

In an embodiment of the integrated FBAR array 70 for use as an embodiment of the FBAR arrays 102 and 104 in which all of the series FBARs have the same resonant frequency and all of the shunt FBARs have the same resonant frequency, different from that of the series FBARs, the resonant frequency of the shunt FBARs is reduced relative to that of the series FBARs by fabricating the shunt FBARs with at least one electrode that is thicker than the corresponding electrode of the shunt FBARs. The process required to fabricate an integrated FBAR array in which the series FBARs all have the same resonant frequency and the shunt FBARs all have the same resonant frequency, different from that of the series FBARs, is only slightly more complex than that required to fabricate an integrated FBAR array in which all the FBARs have the same resonant frequency.

Figure 6:
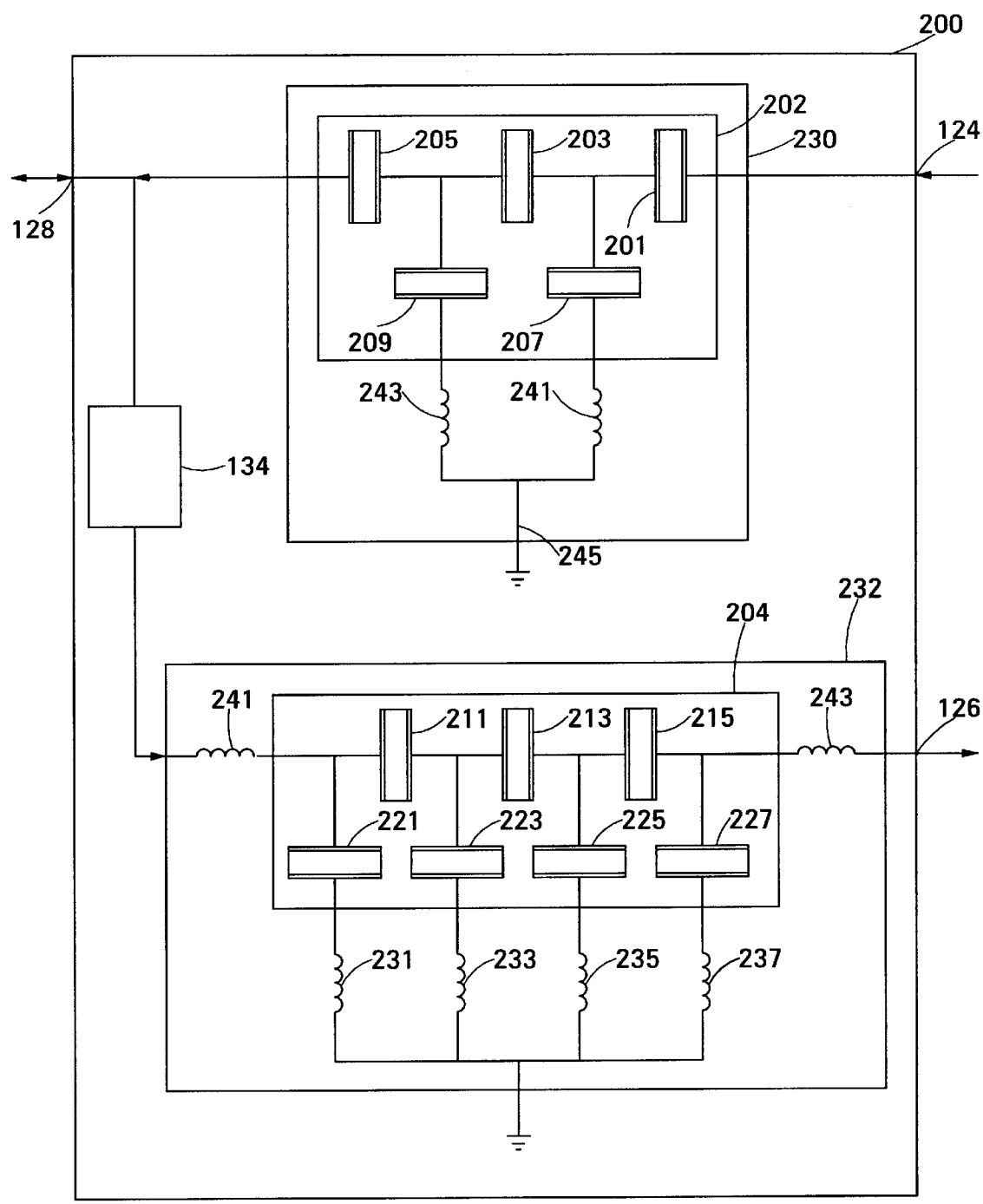
FIG. 6 is a schematic block diagram of a second embodiment of a duplexer according to the invention.

In an embodiment of the integrated FBAR array 70 for use in embodiments of the FBAR arrays 102 and 104 in which the FBARs collectively have more than two resonant frequencies, such as an embodiment of the receive FBAR array 104 for use in the duplexer of a CDMA PCS device, the electrodes of the FBARs have different thicknesses corresponding in number to the number of different resonant frequencies. Fabricating embodiments of the integrated FBAR array for use as the receive FBAR array 104 in the duplexer of a CDMA PCS device, in which the electrodes collectively have more than two different thicknesses, and may have thicknesses corresponding in number to the number of FBARs in the array, is a complex task using present-day integrated FBAR array fabrication techniques. However, fabricating the receive FBAR array in this manner minimizes the size of the duplexer 100, since the duplexer 100 is composed of only of the two FBAR arrays 102 and 104 and the 90° phase shifter 134. FIG. 6 is a schematic block diagram of a second embodiment 200 of a duplexer according to the invention. Compared with the embodiment shown in FIG. 4, this embodiment is somewhat larger, but its receive FBAR array 204 is easier and lower in cost to manufacture using present-day integrated FBAR array fabrication techniques. The duplexer 200 has filter characteristics that makes it suitable for use as the duplexer of a CDMA PCS device, yet both the transmit FBAR array 202 and the receive FBAR array 204 are each composed of series FBARs all having the same resonant frequency and shunt FBARs all having the same resonant frequency, different from that of the series FBARs. This enables an integrated FBAR array in which the FBARs collectively have only two resonant frequencies to be used as each of the FBAR arrays 202 and 204. Such integrated FBAR arrays can be fabricated by a process that is little more complex than that for fabricating FBAR arrays in which the FBARs all have the same resonant frequency. Elements of the duplexer 200 shown in FIG. 6 that correspond to elements of the duplexer shown in FIG. 4 are indicated using the same reference numerals and will not be described again here.

The duplexer 200 is a three-port device having a transmit port 124, a receive port 126 and an antenna port 128 and is composed of the 90° phase shifter 134, the transmit band-pass filter 230 that includes the transmit FBAR array 202 and the receive band-pass filter 232 that includes the receive FBAR array 204. The transmit port is connected to the antenna port through the transmit band-pass filter. The antenna port is connected to the receive port through the series arrangement of the 90° phase shifter and the receive band-pass filter.

When used in a PCS device, cellular telephone or other transmit/receive apparatus, the antenna port 128 of the duplexer 200 is connected to an antenna (not shown), the transmit port 124 is connected to the output of a transmitter (not shown) and the receive port 126 is connected to the input of a receiver (not shown) in a circuit arrangement similar to that shown in FIG. 1A. The pass bands of the band-pass filters 230 and 232 are respectively centered on the frequency range of the transmit signal generated by the transmitter and that of the receive signal to which the receiver can be tuned. In the example shown, band-pass filters 230 and 232 are configured such that the high-frequency stop band of the transmit band-pass filter 230 overlaps the pass-band of the receive band-pass filter 232 and the low-frequency stop band of the receive band-pass filter overlaps the pass-band of the transmit band-pass filter.

The receive band-pass filter 232 will now be described. The receive band-pass filter is composed of the receive FBAR array 204, the series auxiliary inductors 241 and 243 and the shunt auxiliary inductors 231, 233, 235 and 237. The receive FBAR array is composed of the series FBARs 211, 213 and 215 and the shunt FBARs 221, 223, 225 and 227 connected to form a ladder circuit. The series auxiliary inductor 241, the series FBARs 211, 213 and 215 and the series auxiliary inductor 243 are connected in series between end of the 90° phase shifter 134 remote from the antenna port 128 and the receive port 126. The shunt FBAR 221 and the shunt auxiliary inductor 231 are connected in series between ground and the node between the series auxiliary inductor 241 and the series FBAR 211. The shunt FBAR 223 and the shunt auxiliary inductor 233 are connected in series between ground and the node between the series FBARs 211 and 213. The shunt FBAR 225 and the shunt auxiliary inductor 235 are connected in series between ground and the node between the series FBARs 213 and 215. The shunt FBAR 227 and the shunt auxiliary inductor 237 are connected in series between ground and the node between the series FBAR 215 and the series auxiliary inductor 243. Thus, in the example shown, the FBARs and the auxiliary inductors are connected to provide a 3½-stage ladder circuit. However, the number of stages in the ladder circuit is not critical to the invention. The number of full stages and the number of half stages required depends on the desired filter characteristics of the receive band-pass filter 232, the characteristics of the individual FBARs constituting the receive FBAR array 204 and the characteristics of the auxiliary inductors.

In the FBAR array 204, the series FBARs 211, 213 and 215 all have the same resonant frequency and the shunt FBARs 221, 223, 225 and 227 all have the same resonant frequency. In the example shown, the resonant frequency of the series FBARs is about 3% higher than that of the shunt FBARs. When an integrated FBAR array similar to the integrated FBAR array 70 shown in FIGS. 5A and 5B is used as the FBAR array 204, the difference in the resonant frequencies is obtained by an additional process step that deposits additional metal only on the electrodes of the shunt FBARs to increase their mass.

Also in the FBAR array 204, the electrodes of the shunt FBARs 221, 223, 225 and 227 that are not connected to the one of the series FBARs 211, 213 and 215 are connected to separate terminals instead of being connected together and thence to a common terminal. The separate terminals enable the shunt auxiliary inductors 231, 233, 235 and 237 to be connected in series with the shunt FBARs 221, 223, 225 and 227, respectively.

By examining the modified Butterworth-Van Dyke equivalent circuit of an FBAR shown in FIG. 3B, it can be seen that connecting an auxiliary inductor in series with one of the terminals of the FBAR places the auxiliary inductor in series with both the mechanical inductance $L_M$ and the shunt capacitance $C_p$ of the FBAR. Each auxiliary inductance has two main effects, namely, to slightly reduce the frequency of the series resonance of the FBAR, and to introduce an additional series resonance. The auxiliary inductance has a negligible effect on the frequency of the parallel resonance of the FBAR.

Using the auxiliary inductors 231, 233, 235 and 237 to reduce the frequency of the series resonance of the FBARs 221, 223, 225 and 227 constituting the receive band-pass filter 232 by different amounts provides the receive band-pass filter to have ideal frequency characteristics notwithstanding the constraint that all the series FBARs in the FBAR array 204 have the same resonant frequency and all the shunt FBARs in the FBAR array have the same resonant frequency.

The additional series resonance is between the auxiliary inductance and the shunt capacitance $C_p$. Each additional series resonance introduces an additional null in the frequency response of the receive band-pass filter. The value of the auxiliary inductance is designed to set the frequency of the additional resonance to locate the additional null in one of the following frequency regions: the low-frequency end of the transmit band, the cross-over between the transmit band and the receive band, and the high-frequency end of the receive band. The additional nulls in the frequency response of the receive band-pass filter enable practical embodiments to provide an attenuation of greater than 50 dB in parts of the transmit frequency range. This amount of attenuation has not previously been achieved using band-pass filters having a size comparable with that of the band-pass filters according to the invention.

The modeling tools described above are used to model the duplexer 200 and to determine the values of the auxiliary inductors 231, 233, 235, 237, 241 and 243 that provide the receive band-pass filter 232 with its desired filter characteristic despite the FBARs constituting the FBAR array 204 only having two different resonant frequencies. In the example shown, the inductance of the auxiliary inductors is in the range of 2–5 nH. This is small compared with that of the mechanical inductance $L_M$ of the FBARs, which is about 80 nH. Consequently, using relatively poor quality inductors as the auxiliary inductors will not significantly degrade the Q of the series resonance of the FBAR.

In the preferred embodiment, the inductance of each of the shunt auxiliary inductors 231, 233, 235 and 237 was provided by the series combination of the inductance of the respective bonding wire of the package of the FBAR array 204, the inductance of a discrete chip inductor and the inductance of the conductive traces on the printed circuit board on which the FBAR arrays 202 and 204 were mounted to form the duplexer 200. The conductive traces were those connecting a pin on the package to the discrete inductor and connecting the discrete inductor to ground. Moreover, the inductance of the bonding wires of the package of the FBAR array 204 provided at least part of the series auxiliary inductances 241 and 243.

As noted above, in the example shown, the resonant frequency of the series FBARs 211, 213 and 215 of the receive FBAR array 204 is about 80 MHz higher than that of the series FBARs 101, 103 and 105 of the transmit FBAR array 102 to interleave the characteristics of the transmit and receive band-pass filters 130 and 232 as described above.

Not all applications will require that the receive band-pass filter 232 include all of the auxiliary inductors 231, 233, 235, 237, 241 and 243. In such applications, acceptable filter characteristics may be provided by a configuration in which at least one of the shut FBARs is connected directly to ground, as in the embodiment shown in FIG. 4.

The transmit band-pass filter 230 will now be described. If FBARs are available with a Q high enough to meet the desired filter characteristics of the transmit band-pass filter, a band-pass filter identical to the transmit band-pass filter 130 shown in FIG. 4 may be used as the transmit band-pass filter 230. If FBARs with a high-enough Q are not available, or if a greater safety margin on the filter characteristics of the transmit band-pass filter is required, a configuration that includes shunt auxiliary inductors, such as that shown in FIG. 6, may be used as the transmit band-pass filter. The transmit band-pass filter 230 is composed of the transmit FBAR array 202 and the shunt auxiliary inductors 241 and 243. The transmit FBAR array is composed of the series FBARs 201, 203 and 205 and the shunt FBARs 207 and 209 connected to form a ladder circuit. The series FBARs 201, 203 and 205 are connected in series between the transmit port 124 and the antenna port 128. The shunt FBAR 207 and the shunt auxiliary inductor 241 are connected in series between ground and the node between the series FBARs 201 and 203. The shunt FBAR 209 and the shunt auxiliary inductor 243 are connected in series between ground and the node between the series FBARs 203 and 205. Thus, in the example shown, the FBARs and the auxiliary inductors are connected to provide a 2½-stage ladder circuit.

The number of stages in the ladder circuit of the transmit band-pass filter 230 is not critical to the invention. The number of full stages and the number of half stages required depends on the desired filter characteristics of the transmit band-pass filter, the characteristics of the individual FBARs constituting the receive FBAR array 202 and the characteristics of the auxiliary inductors. In one preferred embodiment, the transmit filter is composed of a two-stage ladder circuit that lacks the series FBAR 205.

The effects of the auxiliary inductors on the filter characteristics of the transmit band-pass filter 230 correspond to the above-described effects of the auxiliary inductors on the filter characteristics of the transmit array and will therefore not be described in detail.

As an alternative to connecting an auxiliary inductor in series with each of the shunt FBARs 207 and 209 of the transmit band-pass filter 230, a single auxiliary inductance may be in series with the common ground path 245 of the shunt FBARs 207 and 209. Connecting a single auxiliary inductance as just described increases the above-band rejection and degrades the below-band rejection of the transmit band-pass filter. Auxiliary inductors connected in series with both shunt FBARs, as shown in FIG. 6, increase both the above-band and below-band rejections.

In a prototype embodiment of the duplexer 200 shown in FIG. 6, the insertion loss between the transmit port 124 and the antenna port 128 was less than 3 dB over most of the transmit band. The isolation from the transmit port 124 to the receive port 126 was greater than 50 dB across most of the transmit band and was greater than 46 dB across the receive band.

The band-pass filters 230 and 232 constituting the duplexer 200 consistently have a power handling capability of 2 Watts C.W. across the transmit band.

The measured characteristics of the prototype FBAR-based duplexer according to the invention meet or exceed many of the specifications of the CDMA PCS 1,900 MHz ceramic resonator duplexer described by T. Okada, T.

Tsujiguchi, and H. Matsumoto in *A Miniaturized Dielectric Monoblock Duplexer for 1.9 GHz Band PCS Telephone System*, 96 IEIC TECH. REPORT, IEICE, no. 349, (CPMG 96–103), pp.55–60, (1996). The package dimensions of the prototype FBAR-based duplexer were about 8 mm×5 mm×2 mm, so that the volume of the prototype FBAR-based duplexer was about 1/14 that of the above-mentioned ceramic duplexer. More importantly, the height of the prototype FBAR-based duplexer was about one-third of that of the ceramic duplexer so that the FBAR-based duplexer duplexer is no longer the tallest component on the printed circuit board. This is advantageous in thin form-factor applications such as the handsets of PCS devices, cellular telephones or cordless telephones.

SAW duplexers have approximately the same size as that of the prototype FBAR-based duplexer according to the invention, but SAW technology has yet to achieve the power handling capabilities and high Q needed to meet the roll-off requirements of the CDMA PCS 20 MHz guard band. Consequently, as noted above, more than one SAW filter has to be used to obtain the required characteristics. This imposes a commensurate increase in the volume of the duplexer.

In an FBAR-based duplexer according to the invention, the area of the FBARs constituting the respective FBAR arrays determine the characteristic impedance of the duplexer. The characteristic impedance of the duplexer has to be matched to the characteristic impedance of the antenna. The characteristic impedance of the antenna is typically 50 Ω. Designing the receive FBAR array 204 for a characteristic impedance of 50 Ω results in the shunt FBAR 227 adjacent the receive port 126 being substantially smaller in size than the shunt FBARs 223 and 225, and the shunt FBAR 221 adjacent the 90° phase shifter 134 being smaller in size than the shunt FBARs 223 and 225. The smaller size of the shunt FBAR 227 causes it to have a substantially smaller Q than the remaining shunt FBARs. The smaller Q of the FBAR 227 degrades the filter characteristics of the receive band-pass filter 232.

Figure 7:
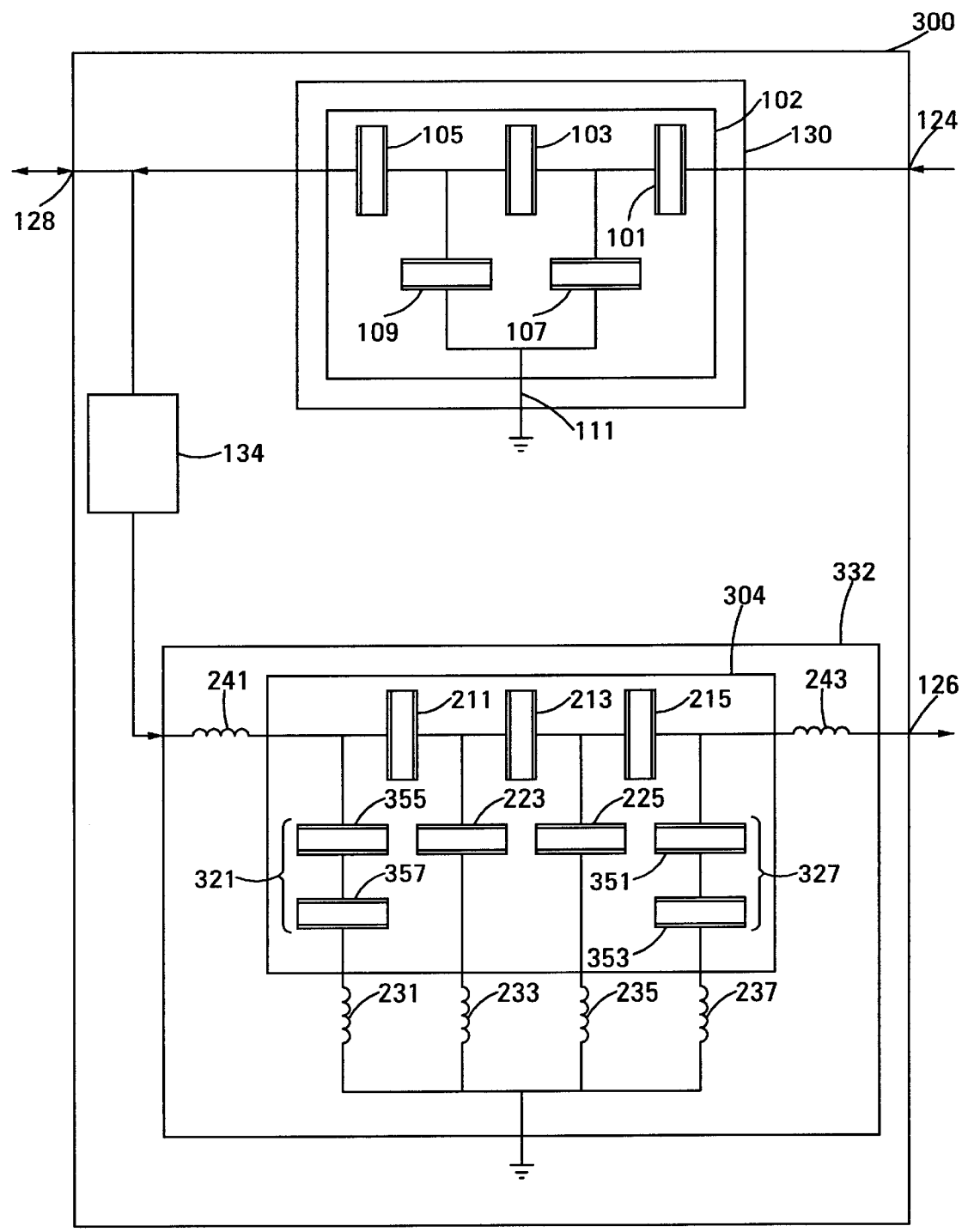
FIG. 7 is a schematic block diagram of a third embodiment of a duplexer according to the invention.

FIG. 7 shows a third embodiment 300 of a duplexer according to the invention. In this embodiment, the receive band-pass filter 332 has a characteristic impedance of 50 Ω, yet the shunt FBAR 327 of the receive FBAR array 304 is composed of elements that are comparable in size and in Q with the shunt FBARs 223 and 225. Elements of the duplexer 300 shown in FIG. 7 that correspond to elements of the duplexers shown in FIGS. 5 and 6 are indicated using the same reference numerals and will not be described again here.

In the duplexer 300, the shunt impedance is kept about the same as that of the FBAR 227 and the Q is improved by using the series arrangement of the two FBARs 351 and 353 that have approximately twice the area of the single FBAR. Thus, the FBARs 351 and 353 have twice the area of FBARs 223 and 225, and have higher Qs. As a result, an embodiment of the duplexer 300 having a 50 Ω characteristic impedance has filter characteristics that are better than those of an embodiment of the duplexer 200 having a 50 Ω characteristic impedance. The series arrangement of the FBARs 351 and 353 also tolerates four times more power than the single FBAR 227.

A further improvement in the filter characteristics of the duplexer 300 is preferably obtained by using the series arrangement of the two FBARs 355 and 357 as the FBAR 321 instead of a single, small-area FBAR.

Although the series-connected FBARs 351 and 353 and 355 and 357 are described above as being equal in area, this is not critical to the invention. The FBARs 351 and 353 can be different in area, provided that the series-connected FBARs provide the required impedance. However, the highest Q is obtained when the FBARs are equal in area. Moreover, the Q can be further increased by using three series-connected FBARS, each having an area approximately three times that of the single FBAR replaced by the three series-connected FBARs.

Although the invention has been described with respect to embodiments in which the FBAR array is embodied in an integrated FBAR array in which the resonant frequencies of the individual FBARs or groups of FBARs are set by defining the physical thickness of one or both electrodes of the FBARs, this is not critical to the invention. As noted above, the resonant frequency of an FBAR depends on the weighted thickness of its piezoelectric resonator stack. The weighted thickness of the piezoelectric resonator stack differs from the physical thickness of the stack because the velocity of sound differs in the different materials of the stack. A weighted thickness, similar in concept to the weighted thickness of the piezoelectric resonator stack, can be assigned to the electrodes of an FBAR. The weighted thickness of the electrodes differs from the physical thickness of the electrodes since it takes account of the velocity of sound in the electrode material. Changing the weighted thickness of one or both of the electrodes of the FBAR changes the weighted thickness of the piezoelectric resonator stack of the FBAR, and hence the resonant frequency of the FBAR. The weighted thickness of the electrodes may be changed by changing the physical thickness of the electrodes, as described above, by changing the electrode material to one in which the velocity of sound is different, or by changing both the electrode thickness and the electrode material. Thus, for example, the FBARs of the integrated FBAR array 70 that constitute the shunt FBARs of the FBAR array 202 can all have the same thickness and the electrodes of the FBARs of the integrated FBAR array 70 that constitute the shunt FBARs of the FBAR array 202 can all have the same thickness, greater than that of the series FBARs. Alternatively, a similar result is obtained by fabricating the electrodes of the FBARs of the integrated FBAR array 70 that constitute the series FBARs of the FBAR array 202 and the electrodes of the FBARs of the integrated FBAR array 70 that constitute the shunt FBARs of the FBAR array 202 from similar thicknesses of different electrode materials. The velocity of sound in the electrode material of the electrodes of the series FBARs would be lower than that in the electrode material of the electrodes of the shunt FBARs.

Although this disclosure describes illustrative embodiments of the invention in detail, it is to be understood that the invention is not limited to the precise embodiments described, and that various modifications may be practiced within the scope of the invention defined by the appended claims.

We claim:

1. A duplexer, comprising:
   a first port, a second port and a third port;
   a first band-pass filter connected between the first port and the third port, the first band-pass filter including a first ladder circuit having shunt and series elements, each of the elements comprising a film bulk acoustic resonator (FBAR); and
   a series circuit connected between the second port and the third port, the series circuit including a 90° phase shifter in series with a second band-pass filter, the second band-pass filter comprising:

a second ladder circuit having shunt and series elements, each of the elements comprising a film bulk acoustic resonator (FBAR).

2. The duplexer of claim 1, in which:

the FBARs each have a resonant frequency;

the FBARs comprised in the series elements of the first band-pass filter all have the same resonant frequency; and the FBARs comprised in the shunt elements of the first band-pass filter all have the same resonant frequency, different from the resonant frequency of the FBARs comprised in the series elements.

3. The duplexer of claim 2, in which the FBARs comprised in the elements of the second band-pass filter collectively have two different resonant frequencies.

4. The duplexer of claim 2, in which the FBARs comprised in the elements of the second band-pass filter collectively have more than two different resonant frequencies.

5. The duplexer of claim 2, in which the FBARs comprised in the elements of the second band-pass filter all have different resonant frequencies.

6. The duplexer of claim 2, in which at least one of the elements of the band-pass filters additionally comprises an auxiliary inductor in series with the FBAR.

7. The duplexer of claim 6, in which:

the FBARs comprised in the series elements of the second band-pass filter all have the same resonant frequency; and the FBARs comprised in the shunt elements of the second band-pass filter all have the same resonant frequency, different from the resonant frequency of the FBARs comprised in the series elements of the second band-pass filter.

8. The duplexer of claim 6, in which:

the first band-pass filter and the second band-pass filter each have an upper band limit and a lower band limit, one of the upper band limit and the lower band limit of the first band-pass filter overlapping the other of the upper band limit and the lower band limit of the second band-pass filter;

the FBAR includes a shunt capacitance; and the auxiliary inductor has an inductance that has a series resonance with the shunt capacitance at a frequency corresponding to one of the upper band limit and the lower band limit of the first band-pass filter and the upper band limit and the lower band limit of the second band-pass filter.

9. The duplexer of claim 2, in which the FBAR comprised in one of the shunt elements includes:

a first FBAR; and a second FBAR in series with the first FBAR.

10. The duplexer of claim 1, in which:

the FBARs each have a resonant frequency; and the FBARs comprised in the elements of at least one of the band-pass filters collectively have two different resonant frequencies.

11. The duplexer of claim 1, in which:

the FBARs each have a resonant frequency; and the FBARs comprised in the elements of at least one of the band-pass filters collectively have more than two different resonant frequencies.

12. The duplexer of claim 1, in which:

the FBARs each have a resonant frequency; and the FBARs comprised in the elements of at least one of the band-pass filters all have different resonant frequencies.

13. The duplexer of claim 1, in which at least one of the elements of the band-pass filters additionally comprises an auxiliary inductor in series with the FBAR comprised therein.

14. The duplexer of claim 13, in which:

the FBARs comprised in the series elements of the second band-pass filter all have the same resonant frequency; and the FBARs comprised in the shunt elements of the second band-pass filter all have the same resonant frequency, different from the resonant frequency of the FBARs comprised in the series elements of the second band-pass filter.

15. The duplexer of claim 13, in which:

the first band-pass filter and the second band-pass filter each have an upper band limit and a lower band limit, one of the upper band limit and the lower band limit of the first band-pass filter overlapping the other of the upper band limit and the lower band limit of the second band-pass filter;

the FBAR includes a shunt capacitance; and the auxiliary inductor has an inductance that has a series resonance with the shunt capacitance at a frequency corresponding to one of the upper band limit and the lower band limit of the first band-pass filter and the upper band limit and the lower band limit of the second band-pass filter.

16. The duplexer of claim 13, in which the auxiliary inductor is in series with the FBAR comprised in one of the shunt elements.

17. The duplexer of claim 16, in which the one of the shunt elements is one of the shunt elements of the second band-pass filter.

18. The duplexer of claim 1, in which the FBAR comprised in one of the shunt elements includes:

a first FBAR; and a second FBAR in series with the first FBAR.

19. The duplexer of claim 1, additionally comprising an auxiliary inductor in series with a common ground connection to two of the shunt elements of at least one of the band-pass filters.

20. A band-pass filter, comprising:

shunt elements; and series elements, in which:
  the series elements and the shunt elements are connected to form a ladder circuit,
  each of the elements includes a film bulk acoustic resonator (FBAR), and
  at least one of the elements additionally includes an auxiliary inductor in series with the FBAR included therein.

21. A band-pass filter, comprising:

shunt elements; and series elements, in which:
  the series elements and the shunt elements are connected to form a ladder circuit,
  each of the elements includes a film bulk acoustic resonator (FBAR),
  the FBARs each have a resonant frequency,
  the FBARs included in the series elements all have the same resonant frequency,
  the FBARs included in the shunt elements all have the same resonant frequency, different from the resonant frequency of the FBARs included in the series elements, and at least one of the elements additionally comprises an auxiliary inductor in series with the FBAR comprised therein.

22. A band-pass filter, comprising:

shunt elements; and series elements, in which:
  the series elements and the shunt elements are connected to form a ladder circuit,
  each of the elements includes a film bulk acoustic resonator (FBAR), and
  the FBARs collectively have more than two different resonant frequencies.

23. The band-pass filter of claim 22, in which the FBARs all have different resonant frequencies.

* * * * *